United States Patent [19]

Suzuki et al.

[11] Patent Number: 5,147,726
[45] Date of Patent: Sep. 15, 1992

[54] ALUMINUM DEPOSITED FILM AND PROCESS FOR PRODUCING IT

[75] Inventors: Motoyuki Suzuki, Kyoto; Yukichi Deguchi, Otsu, both of Japan

[73] Assignee: Toray Industries, Inc., Japan

[21] Appl. No.: 476,481

[22] PCT Filed: Sep. 28, 1989

[86] PCT No.: PCT/JP89/00985
§ 371 Date: May 24, 1990
§ 102(e) Date: May 24, 1990

[87] PCT Pub. No.: WO90/03266
PCT Pub. Date: Apr. 5, 1990

[30] Foreign Application Priority Data

Sep. 29, 1988 [JP] Japan .................. 63-245258
Apr. 18, 1989 [JP] Japan ..................... 1-98367
Sep. 28, 1989 [JP] Japan .................. 63-243433

[51] Int. Cl.⁵ ............................... B32B 15/08
[52] U.S. Cl. ..................... 428/458; 428/409; 428/457; 428/480; 361/323
[58] Field of Search ............. 428/615, 626, 636, 650, 428/686, 450, 457, 480, 458, 409; 361/323

[56] References Cited

U.S. PATENT DOCUMENTS

| | | | |
|---|---|---|---|
| 4,568,413 | 2/1986 | Toth et al. | 428/458 |
| 4,588,654 | 5/1986 | Kobuke et al. | 428/626 |
| 4,816,341 | 3/1989 | Nakayama et al. | 428/458 |
| 4,882,653 | 11/1989 | Suzuki et al. | 361/323 |

FOREIGN PATENT DOCUMENTS 52-55200 7/1977 Japan .
54-88641 10/1979 Japan .
58-16415 1/1983 Japan .

*Primary Examiner*—Merrell C. Cashion, Jr.
*Assistant Examiner*—Hoa T. Le
*Attorney, Agent, or Firm*—Austin R. Miller

[57] ABSTRACT

The present invention relates to an aluminum deposited film and a process for producing it. Since the surface area coefficient C of the surface of the deposited layer is not greater than $1.00 \times 10^{-4}$ or aluminum crystals the [1, 1, 0] planes of which are oriented in parallel with the surface of a base film are contained in an aluminum thin layer in an aluminum deposited film. The corrosion resistance in a high-temperature and high-humidity atomsphere of the aluminum deposited film is excellent. A capacitor coated with the aluminum deposited film has excellent moisture resistance even if its encapsulation is simple, or has increased moisture resistance when its encapsulation is constructed as one similar to that of a conventional capacitor.

11 Claims, 1 Drawing Sheet

ALUMINUM DEPOSITED FILM AND PROCESS FOR PRODUCING IT

TECHNICAL FIELD OF THE INVENTION

The present invention relates to an aluminum deposited film which is wound or stacked into capacitors etc., and a process for producing it.

BACKGROUND ART OF THE INVENTION

An aluminum deposited film is broadly used as a composite of electrodes and dielectrics for capacitors. Since aluminum is not good in chemical stability, however, an aluminum deposited layer generally lacks moisture resistance. Namely, because an aluminum deposited layer has low durability with respect to corrosion in a high-temperature and high-humidity atmosphere, the layer is liable to lose its function required as electrodes of a capacitor. Therefore, in a capacitor using such an aluminum deposited layer, generally its encapsulation is reinforced according to its environment in order to overcome the above defect. However, this reinforcement is often insufficient.

In a case where a deposited layer cannot be formed if the deposition material is directly deposited such as a case where zinc is attempted to be deposited directly on a polypropylene film or a paper, or in a case where formation of a deposited layer is slow and therefore lacks industrial productivity, a process for assisting the formation of the deposited layer by predepositing a metal such as copper or silver which is to become a nuclei for the formation of the zinc deposited layer (so-called, nucleation) is known, for example, as disclosed in JP-A-SHO-58-16415. However, the object, operation and advantage of nucleation are quite different from those of the present invention. Actually, even if nucleation is performed when zinc is deposited, increase of corrosion resistance of the deposited layer in a high-temperature and high-humidity atmosphere, as in the present invention, cannot be achieved.

DISCLOSURE OF THE INVENTION

An object of the present invention is to solve the above defects in conventional aluminum deposited film and to provide an aluminum deposited film which, when it is used for a capacitor, will have sufficiently high moisture resistance even if the encapsulation of the capacitor is simple, or has increased reliability of moisture resistance when encapsulation similar to that in a conventional capacitor is applied, and to provide a process for producing it.

The present invention provides an aluminum deposited film wherein a thin aluminum layer is formed on at least one surface of a plastic film by vacuum deposition characterized in that the surface area coefficient C of the surface of the deposited layer determined by equation (I) is not greater than $1.00 \times 10^{-4}$.

$$C = (Lb - La)/La \qquad (I)$$

(Where, La and Lb are determined from a roughness curve determined by a two beam type scanning electron microscope. La represents the projected length of the roughness curve on a base line and Lb represents the length of the roughness curve.)

Further, the present invention provides an aluminum deposited film wherein a thin aluminum layer is formed on at least one surface of a plastic film by vacuum deposition characterized in that the aluminum thin layer contains aluminum crystals, the [1, 1, 0] planes of which are oriented in parallel with the surface of the base film.

Still further, the present invention provides a process for producing an aluminum deposited film by vacuum deposition of aluminum on a plastic film characterized in that at least one metal selected from the group consisting of gold, silver, copper, nickel and tin is deposited on the plastic film using a deposition amount of not less than 0.1 mg/m² and not greater than 50 mg/m², and then aluminum is deposited on the deposited layer.

Furthermore, the present invention provides a process for producing an aluminum deposited film by vacuum deposition of aluminum on a plastic film characterized in that the surface of the plastic film on which aluminum is to be deposited (hereinafter referred to as the deposition-side surface) is plasma treated in an inert gas atmosphere with a degree of vacuum of $1.0 \times 10^{-1}$ to $1.0 \times 10^{-3}$ torr at an intensity of not less than 5 W min/m² and not greater than 300 W min/m², and then aluminum is deposited on the treated surface in an atmosphere with a degree of vacuum of not greater than $1.0 \times 10^{-3}$ torr, by an apparatus having a compartment for plasma treatment and a compartment for aluminum deposition in a single vacuum chamber, the degrees of vacuum of the compartments being controlled independently from each other.

When the aluminum deposited film according to the present invention is used for a capacitor, the film can have a sufficiently high moisture resistance even if the encapsulation of the capacitor is simple. Moreover, if the encapsulation is similar to that in a conventional capacitor, a capacitor having excellent reliability of moisture resistance can be obtained.

THE BEST MODE FOR CARRYING OUT IN THE INVENTION

Figure 1:
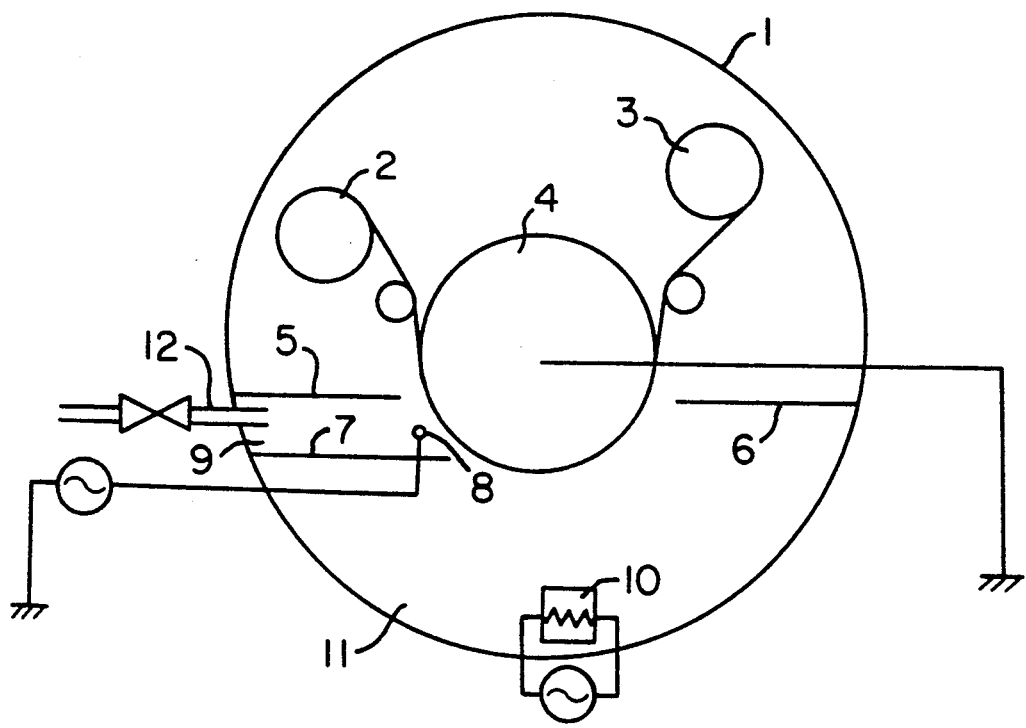
FIG. 1 is a diagram showing one of the concepts of a process for producing an aluminum deposited film according to the present invention. In this figure a compartment for plasma treatment and a compartment for aluminum deposition are both provided in a single vacuum chamber.

In the present invention the plastic film is a thin layer formed from a polymeric resin, i.e., a material generally called a film or a sheet. For example, the term "film" means a sheet-like material whose component is a polyethylene, polypropylene, polyethylene terephthalate, polyethylene naphthalate, polybutylene terephthalate, polycarbonate, polyallylate, polyphenylenesulfide, polyphenylenesulfideketone, polyetheretherketone, polyetherimide, polyimide, polyamide or fluorocarbon resin; or a resin of the mixture or copolymer of the resins. Among the films formed from the above resins, a film formed from a thermoplastic resin having an aromatic ring in its principal chain is effective for the present invention. Particularly, a film formed from at least one resin selected from the group consisting of polyethylene terephthalate, polyethylene naphthalate, polyphenylenesulfide, polyphenylenesulfideketone and polyetheretherketone is preferable from the viewpoint of film forming ability and the heat resistance of the film obtained. Further, a biaxially stretched film formed from a resin of polyethylene terephthalate, polyethylene naphthalate or polyphenylenesulfide is more preferable.

In the present invention, an additional resin other than the above-described resins may be copolymerized or blended at a rate which does not detract from the advantages of the present invention. The copolymerization rate of such an additional resin is preferably not greater than 20 mol %, more preferably not greater than 10 mol %. The blend rate of the additional resin is preferably not greater than 30 wt %, more preferably not greater than 20 wt %. Further, inorganic or organic additives may be added at a rate which does not detract from the advantages of the present invention.

The metallized film according to the present invention is made by forming an aluminum thin layer on at least one surface of a plastic film by vacuum deposition. However, it is not necessary that the entire deposited layer is aluminum, and other metal or nonmetal may simultaneously or sequentially be deposited for the purpose of increasing the strength of the deposited layer, the moisture resistance of the deposited layer or the characteristics of a capacitor. Alternatively, other kinds of substances may be preformed on a plastic film for the similar purpose by, for example, coating, and thereafter, the aluminum thin layer may be deposited. Furthermore, other film, resin or wax may further be laminated or coated on the aluminum thin layer or the nonmetallic surface.

The thickness of the aluminum thin layer is not particularly restricted. When the thickness is in the range of 200 Å, to 1000 Å, however, the advantages due to the present invention become greater. This range of the thickness corresponds nearly to the range of 0.5 Ω to 5 Ω in the surface resistivity of a metallized film.

In the aluminum deposited film according to the present invention, the surface area coefficient C of the surface of the deposited layer determined by equation (I) must not be greater than $1.00 \times 10^{-4}$.

$$C = (Lb - La)/La \tag{I}$$

wherein; La and Lb are determined from a roughness curve determined by a two beam type scanning electron microscope and wherein La represents the projected length of the roughness curve on a base line and Lb represents the length of the roughness curve.

Namely, La and Lb (the length of the roughness curve) are determined by equation (II)

$$La = n \cdot \Delta x$$

$$La = n \cdot \Delta x \tag{II}$$

$$Lb = \sum_{i=1}^{n} [(\Delta x^2 + (y_i - y_{i-1})^2]^{\frac{1}{2}}$$

Where, "x" and "y" represent the coordinates on the axis in the direction of the scanning for measuring the roughness curve by the two beam type scanning electron microscope and on the axis in the height direction of the curve perpendicular to the scanning direction axis, respectively. When the x axis for the roughness curve is divided at intervals of "$\Delta x$" in the scanning direction and the coordinates of the roughness curve are $x_0, x_1, x_2, x_3, ---, x_{n-1}, x_n$ in order, "$y_i$" represents corresponding coordinates of the roughness curve in its height direction which are $y_0, y_1, y_2, y_3, ---, y_{n-1}, y_n$. "x" and "n" are set to $\Delta x = 0.05$ μm and $n \geq 10$ in the present invention. The detail of the measuring conditions of the two beam type scanning electron microscope will be described in the item of methods for estimating characteristics.

In an aluminum deposited film according to another embodiment of the present invention, the aluminum thin layer must contain aluminum crystals, the [1, 1, 0] planes of which are oriented in parallel with the surface of a base film. The orientation of the aluminum crystals is determined by X-ray diffraction. The detail of the determination will be described hereinafter as methods for estimating characteristics. Only the diffraction peaks due to the aluminum crystals are extracted from the diffraction pattern determined by X-ray diffraction by subtracting the value of the diffraction due to the base film and additives from the diffraction pattern. In this determination, when the height of peak of diffraction by the [2, 2, 0] plane (the distance between lattice planes: 1,431 Å) is not less than 3% (preferably not less than 10%) of the height of peak of diffraction by the [1, 1, 1] plane (the distance between lattice planes: 2,338 Å), it is judged that the [1, 1, 0] planes of aluminum crystals are oriented in parallel with the surface of the base film.

In the present invention, if either the aforementioned surface area coefficient C or the above-described orientation of the aluminum crystals is satisfied, the object of the present invention can be accomplished. Of course, both of these characteristics may be satisfied at the same time. The value of the surface area coefficient C and the characteristics of the orientation of the aluminum crystals do not change even after producing a capacitor, and therefore, the value and the characteristic can be determined from a sample of the aluminum deposited film taken from the capacitor.

Next, processes for producing aluminum deposited films according to the present invention will be explained, but the present invention is not restricted by the following processes.

A first producing process is provided wherein a primer comprising at least one metal selected from the group consisting of gold, silver, copper, nickel and tin is deposited on a plastic film at a deposition amount of not less than 0.1 mg/m² and not greater than 50 mg/m², and then aluminum is deposited on the deposited layer. This process is effective when the deposition-side surface of the plastic film is formed from a thermoplastic resin having an aromatic ring in its principal chain, particularly very effective when the thermoplastic resin is one selected from the group consisting of polyethylene terephthalate, polyethylene naphthalate, polyphenylenesulfide and polyethertherketone and among these resins, extremely effective when the main component of the film is polyethylene terephthalate or polyphenylenesulfide.

In the process, at least one kind of metal (hereinafter, called primer) selected from the group consisting of gold, silver, copper, nickel and tin is deposited on a plastic film at a deposition amount of not less than 0.1 mg/m² and not greater than 50 mg/m² by vacuum deposition prior to vacuum deposit aluminum on the plastic film. The deposition amount can be determined by secondary ion mass spectrum analysis (so-called SIMS), and the above range of the deposition amount corresponds to the range of the peak intensity of the primer element of 10 to 10⁵ counts when the film is analyzed in the thickness direction from the surface of the aluminum deposited layer after the aluminum deposition is conducted (the conditions of the analysis are described hereinafter in the description of methods for estimating characteristics.). As the primer, copper among the above metals is preferable from the viewpoint of easy deposition. The atmosphere for the deposition of the primer is preferably not greater than $5.0 \times 10^{-4}$ torr. The process for this deposition is not particularly restricted. Namely, although broadly used processes such as crucible and heater systems or wire feeder and heater systems can be applied when the production is industrially performed, the process for the deposition is not restricted to these systems.

When at least the deposition-side surface of the plastic film is formed from polyphenylenesulfide, it is desirable that a discharge treatment such as corona treatment or plasma treatment is previously performed on the surface to be deposited with the primer, from the viewpoint of increasing the adhesive ability between the plastic film and the deposited layer.

After the deposition of the primer, aluminum is deposited on the primer. When the thickness of the aluminum deposited layer is in the range of 200 Å to 1000 Å, the effect due to the present invention is great. The atmosphere for the aluminum deposition is preferably not greater than $5.0 \times 10^{-4}$ torr. Also in the aluminum deposition, although broadly used processes such as crucible and heater systems or wire feeder and heater systems can be used when the production is industrially performed, the process for the deposition is not restricted to these systems.

The primer deposition and the aluminum deposition may be continuously conducted by, for example, use of a vacuum chamber having two evaporation sources therein. Alternatively, the depositions may be sequentially conducted by two steps of making a primer deposited film and thereafter depositing aluminum on the film by usual processes. The former continuous process is preferable from the point of view of productivity.

In another process for producing an aluminum deposited film according to the present invention, the deposition-side surface of a plastic film is plasma treated in an inert gas atmosphere with a degree of vacuum of $1.0 \times 10^{-1}$ to $1.0 \times 10^{-3}$ torr at an intensity of not less than 5 W min/m$^2$ and not greater than 300 W min/m$^2$, and then aluminum is deposited on the treated surface in an atmosphere with a degree of vacuum of not greater than $1.0 \times 10^{-3}$ torr, by an apparatus having a compartment for plasma treatment and a compartment for aluminum deposition in a single vacuum chamber, the degrees of vacuum of the compartments being controlled independently from each other. This process is effective particularly when the deposition-side surface of the plastic film is formed from a polyester having an aromatic ring in its principal chain such as polyethylene terephthalate or polyethylene naphthalate.

In this process, the plasma treatment is conducted in an inert gas atmosphere having a degree of vacuum of $1.0 \times 10^{-1}$ to $1.0 \times 10^{-3}$ torr. If the degree of vacuum is greater than $1.0 \times 10^{-1}$ torr, the effect due to the treatment is insufficient. If the degree of vacuum is smaller than $1.0 \times 10^{-3}$ torr, the discharge becomes nonuniform and the treatment is insufficient. In order to conduct the treatment uniformly in such an atmosphere, an apparatus wherein the substantial length of an electron beam from a discharge electrode is lengthened (so-called, magnetron) is preferably used. The inert gas is a gas containing an element selected from group VIII in the periodic table preferably at not less than 99% in volume ratio. The content of a gas containing oxygen such as oxygen gas, carbon monoxide gas or carbon dioxide gas is preferably suppressed to a volume ratio of not greater than 0.1%. As the inert gas, argon is preferable from the viewpoint of handling ability etc.

The plasma treatment is conducted at an intensity of not less than 5 W min/m$^2$ and not greater than 300 W min/m$^2$. If the intensity is less than 5 W min/m$^2$, the effect due to the treatment is insufficient. If the intensity is greater than 300 W min/m$^2$, the damage to the film becomes great.

The aluminum deposition must be performed successively to the above plasma treatment under reduced pressure without returning the reduced pressure to atmospheric pressure, in order to achieve the object of the present invention. For this, an apparatus which has a compartment for plasma treatment and a compartment for aluminum deposition in a single vacuum chamber and can control the degrees of vacuum of the compartments independently from each other is required. Such an apparatus can be provided, for example, by reconstructing a usual continuously winding type vacuum deposition apparatus having two separate compartments for winding and deposition such that the degree of vacuum of the compartment for winding can be independently controlled and the compartment for winding can be used as a compartment for plasma treatment by providing a plasma generator in the compartment, or by providing a third compartment between an unwinding portion and the compartment for deposition of the usual deposition apparatus and constituting this third compartment as a compartment for plasma treatment with means which can control its degree of vacuum independently. However, the required apparatus is not restricted to these apparatuses. In any case, since the plasma treatment must be performed in an inert gas atmosphere, the structure for charging the inert gas is required for a compartment functioning as a compartment for plasma treatment.

The aluminum deposition is conducted in an atmosphere having a degree of vacuum of not greater than $1.0 \times 10^{-3}$ torr. If the degree of vacuum is greater than this value, the deposited layer obtained becomes very brittle and sufficient corrosion resistance cannot be obtained. More preferable degree of vacuum for the aluminum deposition is not greater than $2.0 \times 10^{-4}$ torr. Further, the effect due to the present invention is greater when the thickness of the aluminum deposited layer is in the range of 200 to 1000 Å.

Next, methods for determining and estimating characteristics in the present invention will be explained.

(1) Determination of roughness curve by a two beam type scanning electron microscope:

A cross-sectional chart is drawn by determining an aluminum deposited film at 200 points in the horizontal direction, using a two beam and two detector type scanning electron microscope and a cross section measuring apparatus for the microscope. The measuring conditions are as follows.

Apparatus:

(a) two beam and two detector type scanning electron microscope: ESM-3200 produced by Elionics corporation (b) cross section measuring apparatus for the microscope: PSM-1 produced by Elionics corporation Measuring conditions:
magnification: 150,000 times
gain: 15 kV
bias: 6.0 spot size: 5.50

(2) Determination of orientation of aluminum crystal in aluminum thin layer by X-ray diffraction:

A sample is made by stacking three metallized films with the metallized surfaces arranged in the same direction. $\theta$-$2\theta$ scanning is repeated three times, and three measurements of wide angle X-ray diffraction are conducted. The measuring conditions are as X-ray generator:
RU-200B (rotatory anode type) produced by Rigaku Denkisha (a Japanese company) X-ray source: Cu-$K_\alpha$ radiation (X-ray generator with graphite-monochromated Cu-$K_\alpha$ radiation is used.)
output: 40 kV, 100 mA
Goniometer:
2155-D type produced by Rigaku Denkisha slit system: 1°–0.15mm-1°
detector: scintillation counter
Recorder for counting:
RAD-B type produced by Rigaku Denkisha (3) Determination of deposition amount of primer by secondary ion mass spectrum analysis (SIMS):

When an aluminum deposited film is determined from the surface of the aluminum layer in the thickness direction by secondary ion mass spectrum analysis according to the following measuring conditions, the peak intensity (counted number of secondary ion) of the primer element coming out at the boundary between the aluminum layer and the film is determined. Where, the boundary between the aluminum layer and the film is defined as an area from a first transition point of the intensity of an element peculiar to the film (for example, carbon) to a stationary point thereof.

Measuring conditions:

| Apparatus: | A-DIDA 3000 produced by ATOMIKA (West Germany) |
| --- | --- |
| Primary ion: | $O_2^+$ |
| Acceleration voltage for primary ion: | 12 kV |
| Current of primary ion: | 80 nA |
| Raster area: | 400 μm □ |
| Analysis area: | gate 20% |
| Degree of vacuum for determination: | $1 \times 10^{-8}$ torr |
| E-GUN: | 0.5 kV, 3.0 A (Focus; 6.5) |
| H-Q-H: | #13 |

(4) Corrosion resistance:

A sample is made by cutting an aluminum deposited film at the size of 5 cm×5 cm, and the sample is soaked in a thermostatic water bath containing therein the distilled water controlled at 65° C. The surface resistivity of the sample is traced, the time required for increasing the surface resistivity to a value of ten times the initial value is determined, and the resulting data is ranked in accordance with the following criteria of A to E. The longer is this time, the better is corrosion resistance.

| A | not less than 60 minutes |
| --- | --- |
| B | not less than 40 minutes and less than 60 minutes |
| C | not less than 20 minutes and less than 40 minutes |
| D | not less than 10 minutes and less than 20 minutes |
| E | less than 10 minutes |

(5) Moisture resistance of a capacitor:

A capacitor is aged for 1000 hours under the condition of 60° C. and 95% RH, and thereafter, the rate of change of the capacitance is determined. The rate is indicated by $\Delta C/C$, and this is defined as a resulting data of moisture resistance. Where, "C" is a capacitance before aging, and "$\Delta C$" is a variation of the capacitance between before and after aging. The larger is the absolute value of this rate, the worse is moisture resistance. In the determination, the capacitance of a capacitor is measured using an automatic capacitance bridge.

Next, the present invention will be explained in more detail by the following examples. However, the present invention is not restricted by the examples.

EXAMPLE A1

The compartment for deposition of a continuous winding type metallizer (produced by Nihon Shinku Gijutsu Corporation) was divided into two compartments, and the metallizer was reconstructed such that copper could be deposited in the divided front compartment (unwinding side) and aluminum could be deposited in the rear compartment (winding side). Using this apparatus, copper was deposited on a polyethylene terephthalate film ("Lumirror" produced by Toray Industries, Inc., the thickness of the film: 4 μm) at a rate of 0.5 mg/m$^2$ in the front compartment. Then, aluminum was deposited in the successive rear compartment such that the surface resistivity was 2 Ω, and thus an aluminum deposited film was obtained. The film obtained is named as MF-A1. The resulting data of the surface area coefficient C of MF-A1 and the determination of orientation of aluminum crystals in the aluminum thin layer of MF-A1 are shown in Table 1. Margins (non-deposited portions) having a width of 1.0 mm and extending in the form of a stripe in the longitudinal direction of MF-A1 were formed at a pitch of 9 mm by a YAG laser. Cutters were inserted into the center of each of the deposited portions (width: 8.0 mm) and the center of each of the margins (width: 1.0 mm), and slitting was conducted. Tapes each having a width of 4.5 mm and having a margin with a width of 0.5 mm on its left or right side were made and wound.

One obtained tape with the left-side margin and one obtained tape with the right-side margin were wound together, and thus, a wound body having a capacitance of about 0.1 μF was obtained. After a core was drawn out from the wound body, the wound body was heat pressed (120° C., 30 kg/cm$^2$, 5 minutes). Further, a metallicon was sprayed on both end faces of the wound body to make external electrodes, and a capacitor was made by welding lead wires to the metallicon portions. The capacitor obtained is named as C-A1. The result of estimation of moisture resistance of C-A1 is shown in Table 1.

EXAMPLE A2

As shown in FIG. 1, in a continuous winding type metallizer (produced by Nihon Shinku Gijutsu Corporation) having a partition 5 between an unwinding portion including a unwinding roll 2 and a deposition compartment 11 and a partition 6 between the deposition compartment and a winding portion including a winding roll 3, another partition 7 having the same structure as that of the partition 5 was provided between the unwinding portion and the deposition compartment. An introducing pipe 12 was provided between partitions 5 and 7 such that a gas could be introduced between the partitions from outside. A high-voltage application electrode (magnetron) 8 was provided in parallel relation to the axis of a cooling can 4 constituted as a counter electrode by earth and spacedly from the surface of the can at a distance of 10 mm. Thus, a compartment for plasma treatment 9 was newly provided. In FIG. 1, an induction heater is indicated by numeral 10.

Using this apparatus, plasma treatment was conducted on the surface of a polyethylene terephthalate film ("Lumirror" produced by Toray Industries, Inc., the thickness of the film: 4 μm) in an argon atmosphere having a degree of vacuum of $2.0 \times 10^{-3}$ torr at a treatment intensity of 60 W min/m$^2$. Successively, aluminum was deposited on the film in an atmosphere having a degree of vacuum of $8.0 \times 10^{-5}$ torr such that the surface resistivity of the film became 2 Ω. Thus, an aluminum deposited film was obtained. The thickness of the aluminum layer was about 350 Å. This film is named as MF-A2. The resulting data of the surface area coefficient C of MF-A2 and the determination of orientation of aluminum crystals in the aluminum thin layer are shown in Table 1.

A capacitor was made using MF-A2 in the same manner as that of Example A1. The capacitor obtained is named as C-A2. The result of estimation of moisture resistance of C-A2 is shown in Table 1.

EXAMPLE A3

An aluminum deposited film was made in the same manner as that of Example A1 other than the condition that a film was a biaxially stretched polyphenylenesulfide film ("Torelina" produced by Toray Industries, Inc., the thickness of the film: 4 μm). This aluminum deposited film is named as MF-A3. The resulting data of the surface area coefficient C of MF-A3 and the determination of orientation of aluminum crystals in the aluminum thin layer are shown in Table 1.

A capacitor was made using MF-A3 in the same manner as that of Example A1. The condition of the heat pressing was 180° C., 15 kg/cm$^2$ and 5 minutes. The capacitor obtained is named as C-A3. The result of estimation of moisture resistance of C-A3 is shown in Table 1.

EXAMPLE A4

An aluminum deposited film was made in the same manner as that of Example A2 other than the condition that a film was a biaxially stretched polyphenylenesulfide film ("Torelina" produced by Toray Industries, Inc., the thickness of the film: 4 μm). This aluminum deposited film is named as MF-A4. The resulting data of the surface area coefficient C of MF-A4 and the determination of orientation of aluminum crystals in the aluminum thin layer are shown in Table 1.

A capacitor was made using MF-A4 in the same manner as that of Example A2. The condition of the heat pressing was 180° C., 15 kg/cm and 5 minutes. The capacitor obtained is named as C-A4. The result of estimation of moisture resistance of C-A4 is shown in Table 1.

COMPARATIVE EXAMPLE A1

An aluminum deposited film was made by a usual process, i.e., in the same manner as that of Example A1 other than the condition that the deposition of copper and plasma treatment were not conducted. This film is named as MF-A5. The resulting data of the surface area coefficient C of MF-A5 and the determination of orientation of aluminum crystals in the thin aluminum thin layer are shown in Table 1.

A capacitor was made using MF-A5 in the same manner as that of Example A1. The capacitor obtained is named as C-A5. The result of estimation of moisture resistance of C-A5 is shown in Table 1.

COMPARATIVE EXAMPLE A2

An aluminum deposited film was made by a usual process, i.e., in the same manner as that of Example A3 other than the condition that the deposition of copper and plasma treatment were not conducted. This film is named as μF-A6. The resulting data of the surface area coefficient C of MF-A6 and the determination of orientation of aluminum crystals in the aluminum thin layer are shown in Table 1.

A capacitor was made using MF-A6 in the same manner as that of Example A3. The capacitor obtained is named as C-A6. The result of estimation of moisture resistance of C-A6 is shown in Table 1.

EXAMPLES B1-B11 and Comparative Examples B1-B7

Various aluminum deposited films were made in the same manner as that of Example A1 by changing base films, primers and the deposition amounts of the primers. These films are named as MF-B1 to MF-B18. The manufacturing conditions and the results of corrosion resistance thereof are shown in Table 2.

Where, a polyethylene naphthalate film used as base films for MF-B5 and MF-B12 was obtained by the following process.

Polyethylene-2,6-naphthalate having an ultimate viscosity of 0.60 was polymerized from ethylene glycol and naphthalene-2,6-dicarboxylic acid by a regular process. Then, 0.2 wt % calcium carbonate having a mean particle size of 1.2 μm was added to the polymer to obtain a polyethylene naphthalate resin. This resin was delivered out from an extruder equipped with a T-die in a form of a sheet. The sheet was rapidly cooled on a casting drum to obtain a substantially amorphous sheet. The sheet was sequentially stretched biaxially at draw ratios of 3.5 times and 3.5 times, and heat treated. Thus, a biaxially stretched polyethylene-2,6-naphthalate film having a thickness of 4 μm was obtained.

A polyetheretherketone film used as base films for MF-B6 and MF-B13 was obtained by the following process.

A polyetheretherketone (PEEK 380G produced by I.C.I.) was delivered out from an extruder equipped with a T-die in a form of a sheet. The sheet was rapidly cooled on a casting drum to obtain a substantially amorphous sheet. The sheet was sequentially stretched biaxially at draw ratios of 2.5 times and 2.5 times, and heat treated. Thus, a biaxially stretched polyetheretherketone film having a thickness of 4 μm was obtained.

Further, a polypropylene film "Torayfan" produced by Toray Industries, Inc. (the thickness of the film: 4 μm) was applied to base films for MF-B7 and MF-B14.

EXAMPLES C1-C10 AND COMPARATIVE EXAMPLES C1-C10

Various aluminum deposited films were obtained using the apparatus used in Example A2 and using a biaxially stretched polyethylene terephthalate film ("Lumirror" produced by Toray Industries, Inc., the thickness of the film: 2 μm) and a biaxially stretched polyphenylenesulfide film ("Torelina" produced by Toray Industries, Inc., the thickness of the film: 2 μm) as base films, by changing the atmosphere for plasma treatment, the intensity of plasma treatment and the atmosphere for aluminum deposition. The films obtained are named as MF-C1 to MF-C20. The manufacturing condition is and the results of corrosion resistance thereof are shown in Table 3.

Industrial Applications of the Invention

The aluminum deposited film having the above-described constitution according to the present invention can greatly improve the corrosion resistance of the aluminum deposited layer in a high-temperature and high-humidity atmosphere which is a problem in a conventional aluminum deposited film. As a result, a capacitor using this aluminum deposited film can have an excellent moisture resistance even if its encapsulation is simple, or can increase its moisture resistance to a great extent when its encapsulation is constructed as one similar to that of a conventional capacitor. Therefore,

TABLE 1

| | Film No. | Surface area coefficient C | [1, 1, 0] Orientation of aluminum crystal | Moisture resistance of capacitor | |
|---|---|---|---|---|---|
| | | | | Capacitor No. | ΔC/C (%) |
| Example A1 | MF-A1 | $0.50 \times 10^{-4}$ | present | C-A1 | +0.5 |
| Example A2 | MF-A2 | $0.81 \times 10^{-4}$ | present | C-A2 | +0.0 |
| Example A3 | MF-A3 | $0.42 \times 10^{-4}$ | present | C-A3 | +2.5 |
| Example A4 | MF-A4 | $0.73 \times 10^{-4}$ | present | C-A4 | +0.0 |
| Comp. Ex. A1 | MF-A5 | $2.53 \times 10^{-4}$ | none | C-A5 | −96.8 |
| Comp. Ex. A2 | MF-A6 | $1.85 \times 10^{-4}$ | none | C-A6 | −63.4 |

TABLE 2

| | Film No. | Base film | Primer Kind of Metal | Primer Deposition amount (mg/m²) | Main deposited metal | Corrosion resistance |
|---|---|---|---|---|---|---|
| Example B1 | MF-B1 | polyethylene terephthalate | copper | 0.5 | aluminum | A |
| Example B2 | MF-B2 | polyethylene terephthalate | copper | 40 | aluminum | B |
| Example B3 | MF-B3 | polyphenylenesulfide | copper | 0.5 | aluminum | A |
| Example B4 | MF-B4 | polyphenylenesulfide | copper | 40 | aluminum | B |
| Example B5 | MF-B5 | polyethylene naphthalate | copper | 0.5 | aluminum | A |
| Example B6 | MF-B6 | polyetheretherketone | copper | 0.5 | aluminum | B |
| Example B7 | MF-B7 | polypropylene | copper | 0.5 | aluminum | B |
| Comp.Ex. B1 | MF-B8 | polyethylene terephthalate | — | none | aluminum | E |
| Comp.Ex. B2 | MF-B9 | polyethylene terephthalate | copper | 70 | aluminum | D |
| Comp.Ex. B3 | MF-B10 | polyphenylenesulfide | — | none | aluminum | D |
| Comp.Ex. B4 | MF-B11 | polyphenylenesulfide | copper | 70 | aluminum | D |
| Comp.Ex. B5 | MF-B12 | polyethylene naphthalate | — | none | aluminum | C |
| Comp.Ex. B6 | MF-B13 | polyetheretherketone | — | none | aluminum | E |
| Comp.Ex. B7 | MF-B14 | polypropylene | copper | 0.5 | zinc | E |
| Example B8 | MF-B15 | polyethylene terephthalate | gold | 0.5 | aluminum | B |
| Example B9 | MF-B16 | polyethylene terephthalate | silver | 0.5 | aluminum | A |
| Example B10 | MF-B17 | polyethylene terephthalate | tin | 0.5 | aluminum | B |
| Example B11 | MF-B18 | polyethylene terephthalate | nickel | 0.5 | aluminum | A |

TABLE 3

| | Film No. | Base film | Plasma treatment Atmosphere (torr) | Plasma treatment Intensity (Wmin/m²) | Atmosphere for aluminum deposition (torr) | Corrosion resistance |
|---|---|---|---|---|---|---|
| Example C1 | MF-C1 | polyethylene terephthalate | $2.0 \times 10^{-3}$ | 60 | $8.0 \times 10^{-5}$ | A |
| Example C2 | MF-C2 | polyethylene terephthalate | $8.1 \times 10^{-2}$ | 10 | $8.0 \times 10^{-5}$ | B |
| Example C3 | MF-C3 | polyethylene terephthalate | $2.0 \times 10^{-3}$ | 290 | $8.0 \times 10^{-5}$ | A |
| Example C4 | MF-C4 | polyethylene terephthalate | $8.1 \times 10^{-2}$ | 260 | $8.0 \times 10^{-5}$ | B |
| Example C5 | MF-C5 | polyethylene terephthalate | $8.1 \times 10^{-3}$ | 260 | $7.8 \times 10^{-4}$ | B |
| Example C6 | MF-C6 | polyphenylenesulfide | $2.0 \times 10^{-3}$ | 20 | $8.0 \times 10^{-5}$ | C |
| Example C7 | MF-C7 | polyphenylenesulfide | $8.1 \times 10^{-2}$ | 20 | $8.0 \times 10^{-5}$ | B |
| Example C8 | MF-C8 | polyphenylenesulfide | $2.0 \times 10^{-3}$ | 290 | $8.0 \times 10^{-5}$ | A |
| Example C9 | MF-C9 | polyphenylenesulfide | $8.1 \times 10^{-2}$ | 260 | $8.0 \times 10^{-5}$ | A |
| Example C10 | MF-C10 | polyphenylenesulfide | $8.1 \times 10^{-2}$ | 260 | $7.8 \times 10^{-4}$ | B |
| Comp. Ex. C1 | MF-C11 | polyethylene terephthalate | $7.3 \times 10^{-4}$ | 10 | $8.0 \times 10^{-5}$ | D |
| Comp. Ex. C2 | MF-C12 | polyethylene terephthalate | $2.2 \times 10^{-1}$ | 40 | $8.0 \times 10^{-5}$ | D |
| Comp. Ex. C3 | MF-C13 | polyethylene terephthalate | $2.0 \times 10^{-3}$ | 2 | $8.0 \times 10^{-5}$ | D |
| Comp. Ex. C4 | MF-C14 | polyethylene terephthalate | $8.1 \times 10^{-2}$ | 400 | Film was broken | Not estimated |
| Comp. Ex. C5 | MF-C15 | polyethylene terephthalate | $8.1 \times 10^{-2}$ | 260 | $1.5 \times 10^{-3}$ | D |
| Comp. Ex. C6 | MF-C16 | polyphenylenesulfide | $7.3 \times 10^{-4}$ | 20 | $8.0 \times 10^{-5}$ | D |
| Comp. Ex. C7 | MF-C17 | polyphenylenesulfide | $2.2 \times 10^{-1}$ | 20 | $8.0 \times 10^{-5}$ | D |
| Comp. Ex. C8 | MF-C18 | polyphenylenesulfide | $2.0 \times 10^{-3}$ | 2 | $8.0 \times 10^{-5}$ | D |
| Comp. Ex. C9 | MF-C19 | polyphenylenesulfide | $8.1 \times 10^{-2}$ | 450 | Film was broken | Not estimated |
| Comp. Ex. C10 | MF-C20 | polyphenylenesulfide | $8.1 \times 10^{-2}$ | 260 | $1.5 \times 10^{-3}$ | D |

We claim:

1. An aluminum deposited film wherein an aluminum thin layer is formed on at least one surface of a plastic film by vacuum deposition characterized in that the surface area coefficient C of the surface of said deposited layer determined by equation (I) is not greater than $1.00\times10^{-4}$ where equation (I) is defined as $$C=(Lb-La)/La \quad (I)$$

wherein:
- a. La and Lb are determined from a roughness curve determined by a two beam type scanning electron microscope;
- b. La and Lb represent the projected length of said roughness curve on a base line and the length of said roughness curve, respectively; and
- c. La and Lb are determined by equations (II) and (III) respectively where equations (II) and (III) are defined as $$La = n \cdot \Delta x \quad (II)$$

$$Lb = \sum_{i=1}^{n} [(\Delta x^2 + (y_i - y_{i-1})^2)]^{\frac{1}{2}} \quad (III)$$

wherein "x" and "y" represent the coordinates on the axis in the direction of the scanning for measuring the roughness curve by the two beam type scanning electron microscope and on the axis in the height direction of the curve perpendicular to the scanning direction axis, respectively.

2. An aluminum deposited film wherein an aluminum thin layer is formed on at least one surface of a plastic base film by vacuum deposition characterized in that said aluminum thin layer contains aluminum crystals the planes of which are oriented in parallel with the surface of said base film.

3. An aluminum deposited film wherein an aluminum thin layer is formed on at least one surface of a plastic base film by vacuum deposition characterized in that the surface area coefficient C of the surface of said deposited layer determined by equation (I) is not greater than $1.00\times10^{-4}$, and said aluminum thin layer contains aluminum crystals the planes of which are oriented in parallel with the surface of said base film, wherein $$C=(Lb-La)/La \quad (I)$$

wherein:
- a. La and Lb are determined from a roughness curve determined by a two beam type scanning electron microscope;
- b. La and Lb represent the projected length of said roughness curve on a base line and the length of said roughness curve, respectively; and
- c. La and Lb are determined by equations (II) and (III) respectively where equations (II) and (III) are defined as $$La = n \cdot \Delta x \quad (II)$$

$$Lb = \sum_{i=1}^{n} [(\Delta x^2 + (y_i - y_{i-1})^2)]^{\frac{1}{2}} \quad (III)$$

wherein "x" and "y" represent the coordinates on the axis in the direction of the scanning for measuring the roughness curve by the two beam type scanning electron microscope and on the axis in the height direction of the curve perpendicular to the scanning direction axis, respectively.

4. The aluminum deposited film according to any of claims 1, 2, to 3, wherein said plastic film is formed from a thermoplastic resin having an aromatic ring in its principal chain.

5. The aluminum deposited film according to any of claims 1, 2, to 3, wherein said plastic film is formed from at least one resin selected from the group consisting of polyethylene terephthalate, polyethylene naphthalate, polyphenylenesulfide, polyphenylenesulfideketone and polyetheretherketone.

6. The aluminum deposited film according to any of claims 1, 2, to 3, wherein said plastic film is a biaxially stretched film.

7. A process for producing an aluminum deposited film by vacuum deposition of aluminum on a plastic film characterized in that at least one primer metal selected from the group consisting of gold, silver, copper, nickel and tin is deposited in a layer on said plastic film in a deposition amount of not less than 0.1 mg/m² and not greater than 50 mg/m², and aluminum is deposited on said deposited primer layer.

8. A process for producing an aluminum deposited film by vacuum deposition of aluminum on a deposition side of a plastic film, characterized in that the deposition side surface of said plastic film is plasma treated in an inert gas atmosphere with a degree of vacuum of $1.0\times10^{-1}$ to $1.0\times10^{-3}$ torr at an intensity of not less than 5 W min/m² and not greater than 300 W min/m², and then aluminum is deposited on the treated surface in an atmosphere with a degree of vacuum of not greater than $1.0\times10^{-3}$ torr, in a compartment for plasma treatment and a compartment for aluminum deposition in a single vacuum chamber, the degrees of vacuum of said compartments being controlled independently from each other.

9. The process for producing an aluminum deposited film according to claim 7 or 8, wherein said plastic film is formed from a thermoplastic resin having an aromatic ring in its principal chain.

10. The process for producing an aluminum deposited film according to claim 7 or 8, wherein said plastic film is formed from at least one resin selected from the group consisting of polyethylene terephthalate, polyethylene naphthalate, polyphenylenesulfide, polyphenylenesulfideketone and polyetheretherketone.

11. The process for producing an aluminum deposited film according to claim 7 or 8, wherein said plastic film is a biaxially stretched film.

* * * * *

UNITED STATES PATENT AND TRADEMARK OFFICE
CERTIFICATE OF CORRECTION

PATENT NO. : 5,147,726

DATED : September 15, 1992

INVENTOR(S) : Motoyuki Suzuki et al

It is certified that error appears in the above-identified patent and that said Letters Patent is hereby corrected as shown below:

In Column 13, line 43, before the word "planes", please insert -- [1,1,0]-- and in line 52, before the word "planes", please insert --(1,1,0)--.

In Column 3, line 45, please change "equation (II)" to --equations (II) and (III).--, at about line 46, please delete the first formula "La=n·$\Delta$x" and at about line 53 to the right of the third formula, at the margin, please insert --(III)--.

Signed and Sealed this

Sixth Day of July, 1993

Attest:

MICHAEL K. KIRK

Attesting Officer

Acting Commissioner of Patents and Trademarks